(12) United States Patent
Wang (10) Patent No.: US 6,546,621 B2
(45) Date of Patent: Apr. 15, 2003

(54) PACKAGE STRUCTURE AND METHOD FOR A CARD

(75) Inventor: Hank Wang, Hsinchu (TW)

(73) Assignee: 3 View Technology Co., Ltd., Hsinchu (TW)

( * ) Notice: Subject to any disclaimer, the term of this patent is extended or adjusted under 35 U.S.C. 154(b) by 0 days.

(21) Appl. No.: 09/843,855

(22) Filed: Apr. 30, 2001

(65) Prior Publication Data

US 2002/0127767 A1 Sep. 12, 2002

(30) Foreign Application Priority Data

Mar. 9, 2001 (TW) .................................. 90105663 A
Mar. 9, 2001 (TW) .................................. 90203602 U (51) Int. Cl.⁷ .............................. H05K 3/30; H01S 4/00
(52) U.S. Cl. ...................................... 29/841; 29/592.1
(58) Field of Search ............................... 438/106–127; 174/62, 61, 59, 50, 50.5, 52.1, 52.3, 52.4; 29/841, 592.1; 235/492; 361/736, 737, 742, 743, 745, 752, 758, 825, 829

(56) References Cited

U.S. PATENT DOCUMENTS

| | | | | |
|---|---|---|---|---|
| 4,618,516 A | * | 10/1986 | Sager ........................... 428/35 |
| 5,242,310 A | * | 9/1993 | Leung ........................... 439/76 |
| 5,397,857 A | * | 3/1995 | Farquhar et al. ............ 174/52.1 |
| 5,475,919 A | * | 12/1995 | Wu et al. ....................... 29/841 |
| 5,476,387 A | * | 12/1995 | Ramey et al. ............. 439/76.1 |
| 5,481,434 A | * | 1/1996 | Banakis et al. ............. 361/756 |
| 5,497,297 A | * | 3/1996 | Kilmer et al. ............... 361/737 |
| 5,502,892 A | * | 4/1996 | Lien ............................. 29/841 |
| 5,596,486 A | * | 1/1997 | Young et al. ................ 361/737 |
| 6,105,244 A | * | 8/2000 | Lin et al. ....................... 29/841 |
| 6,108,209 A | * | 8/2000 | Cox et al. .................... 361/737 |
| 6,166,324 A | * | 12/2000 | Oldendorf et al. ........ 174/35 R |
| 6,269,537 B1 | * | 8/2001 | Kimura et al. ................ 29/832 |
| 6,320,252 B1 | * | 11/2001 | Potters et al. ............... 257/679 |

OTHER PUBLICATIONS

Loctite, Inc., Research, Development & Engineering; Technical Data Sheet, Product 3619, Aug. 1999, 2 pages.*

* cited by examiner

Primary Examiner—Kamand Cuneo
Assistant Examiner—Scott Geyer
(74) Attorney, Agent, or Firm—Bacon & Thomas, PLLC (57) ABSTRACT

A package structure and method for a card comprises respective attachment of first and second conductive covers each having a vertical piece extending on one side thereof with first lateral surface of first and second plastic frames in use of a low temperature adhesive therebetween to form first and second half cases, and combination of the first and second half cases with insertion of another adhesive or sonic welding between second lateral surfaces of the first and second plastic frames. The plastic frame also has an outer surface formed with a recess to accommodate the vertical piece of the conductive cover and an adhesive area on the first lateral surface formed deep into the plastic frame to be coated with the low temperature adhesive in order for the attachment of the conductive cover. Each of the first and second plastic frames is further formed with a trench or through hole for clamping a conductive piece with a hook shape in contact with the conductive cover and the other conductive piece on the other plastic frame.

13 Claims, 12 Drawing Sheets

PACKAGE STRUCTURE AND METHOD FOR A CARD

FIELD OF THE INVENTION

The present invention relates generally to a package of an electronic device, and more particularly, to a package structure and method for a card.

BACKGROUND OF THE INVENTION

A package of a card-sized electronic device has to provide essential mechanical strength and electric performance, at least conformed to some specific standards and criterion. The structure of the package also has to be used adaptively for package process in order for mass production, and the cost-effectiveness is particularly important. Card-sized electronic devices, such as modem card, LAN care, and memory card, are widely used, and the trend is toward downsizing for such devices. Personal Computer Memory Card International Association (PCMCIA) and compact flash (CF) are typical international standards for memory cards, and new standards are still emerging. While some details exist among various card standards, their package structures are similar, in which a printed circuit board (PCB) is encapsulated with a case whose cover is electrically conductive and provides a ground sidepiece to be electrically connected with the system reference in the slot of the apparatus inserted with the card.

A conventional package method sandwiches a PCB between two plastic frames with two metal covers thereon riveted by a tool so as to encapsulate the plastic frames and PCB. However, the metal covers and plastic frames cannot be tightly bonded by riveting. As a result, the metal covers are likely to loosen and become separated from the package. Moreover, the riveting process may deform the metal covers, and the mechanical strength of the package formed by riveting is poor.

An improvement for the package method applies high temperature adhesive on the internal surface of a metal cover. In a package process, the metal cover is heated to over 80° C. to melt the adhesive for attachment of the metal cover with a plastic frame thereon, and then two metal covers with each a plastic frame thereon are riveted to encapsulate a PCB therebetween after a cooling process to confirm the adhesives between the metal covers and plastic frames. The prior art requires heating and cooling processes, which is somewhat bothersome and time-consuming. In addition, possibilities are inherent that the attached plastic frame on the metal cover may be dropped from the cover during the riveting process, thus poor performance is still employed.

Further improved package structure and method are proposed respectively in U.S. Pat. Nos. 5,397,857, 5,475,919, and 5,490,891, by which a metal cover is positioned in a mold to be directly bonded with a plastic frame with an injection molding such that a half case is formed, and then a package is completed with two half cases by combining the plastic frames respectively on the two half cases together by sonic welding. Such package offers better mechanical strength and simpler manufacture process than prior arts, while in payment of higher technique and more cost for material and manufacture. At first, the metal cover has to be formed with hooks or curved fingers on each sides to be embedded into the plastic frame during direct injection molding, so as to be firmly bonded itself with the plastic frame. For the formation of such hooks or fingers on each side of a metal cover, a longer metal plate enough for the length of the hooks or fingers is used and bent many times. Therefore, the manufacture process of the metal cover is more time-consuming, complex, and difficult, cost for material and manufacture is also more, tools to be used in the process are larger, and there is more attrition to the tools. In addition, the precision requirement for the metal cover to be positioned in the mold with the plastic frame injection molded thereon is critical and strict. Further, in order for electrical connection between two metal covers by contact with each other and welded combination of two plastic frames respectively on the covers at the same time, the precision requirement for the metal cover is more critical and strict. Also, molds with high precision for such metal covers and plastic frames are very expensive, which thus increases the manufacture cost. Finally, each time only one metal cover can be enclosed within the cavity of a mold for injection molding with such prior arts. In this manner, a mold can injection-mold only one plastic frame each time, which is adverse to mass production. Therefore, it is desired alternative approach or improvement on package structure and method for a card.

SUMMARY OF THE INVENTION

One object of the present invention is to provide a package structure and method for a card advantageous to manufacture process, time, cost, and reliability. According to the present invention, a package structure and method for a card comprises respective attachment of first and second conductive covers each having a vertical piece extending on one side thereof with first lateral surface of first and second plastic frames in use of a low temperature adhesive therebetween to form first and second half cases, and combination of the first and second half cases with insertion of another adhesive or sonic welding between second lateral surfaces of the first and second plastic frames. Preferably, one welding line is formed or one chemical is applied on one or both of the second lateral surfaces of the first and second plastic frames in order for sonic welding of the first and second plastic frames. Alternatively, one adhesive area is formed along and deep into one or both of the second lateral surfaces of the first and second plastic frames in order for adhesion of the first and second plastic frames with the another adhesive.

Further to the first and second lateral surfaces, the plastic frame has an outer surface preferably formed with a recess to accommodate the vertical piece of the conductive cover, by which the outer surface of the vertical piece is not lower than the outer surface of the plastic frame. An adhesive area is formed preferably deep into the plastic frame to be coated with the low temperature adhesive in order for the attachment of the conductive cover.

Each of the first and second plastic frames is further formed with a trench or through hole for clamping a conductive piece, preferably with a hook shape, in contact with the conductive cover and the other conductive piece on the other plastic frame.

Preferably, the second lateral surfaces of the first and second plastic frames have corresponding positioning holes and heads so as to bond the plastic frames together.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION OF THE INVENTION

In a package according to the present invention, the components includes two conductive covers and two plastic frames, in which one conductive cover is bonded with one plastic frame to form a half case, and two half cases are bonded together to form the package. Two identical conductive covers, as well as two identical plastic frames, can be used in one package. In this manner, there are fewer types of components and thus the material management can be simplified; moreover, if identical conductive covers, plastic frames and half cases are used in the package process, component misuse or erroneous assembly can be avoided.

Figure 1:
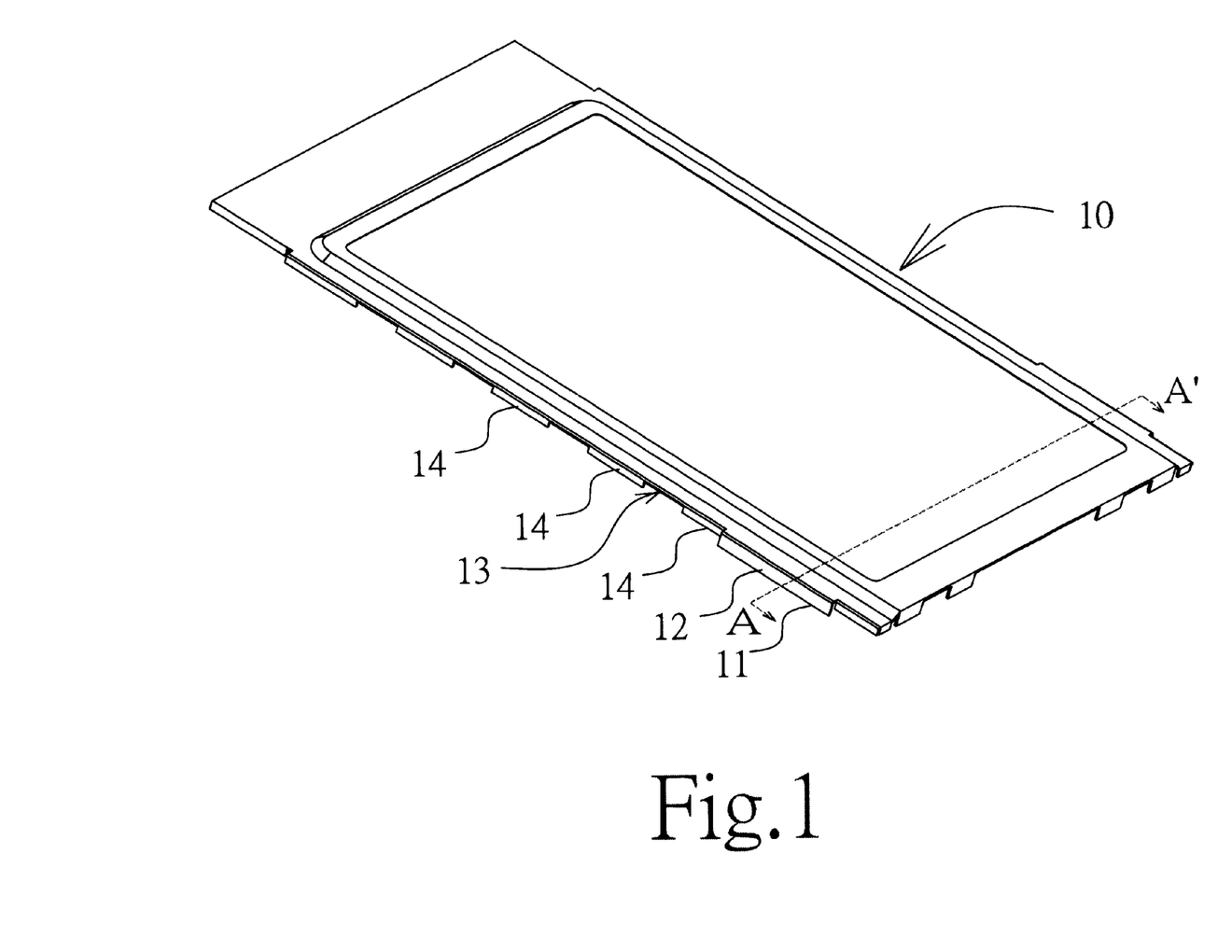
FIG. 1 is a perspective view of the conductive cover.
Figure 1A:
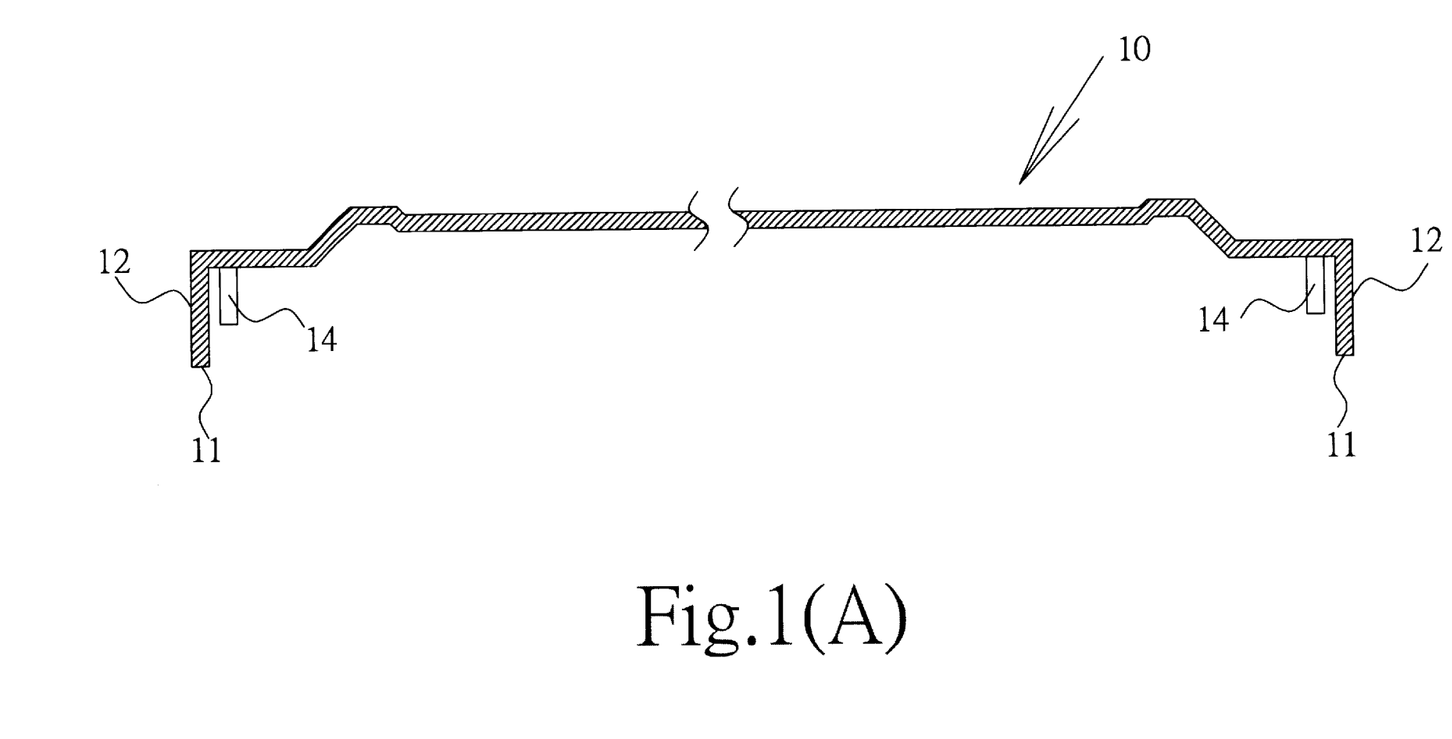
FIG. 1(A) is a cross sectional view of the conductive cover shown in FIG. 1 along line A–A'.

FIG. 1 is a perspective view of one embodiment of the conductive cover for the package, and the cross sectional view along line A–A' is shown in FIG. 1(A). On the two sides of a conductive cover 10, vertical pieces 11 and 14 are formed with spaces 13 therebetween. The vertical piece 11 has an outer surface 12 and is more protruded than the vertical piece 14. The conductive cover 10 is preferably made of stainless steel, but not limited thereto. In one preferred embodiment, a plate made of stainless steel is stamped and bent to form the structure as of the conductive cover 10. Compared with prior arts, the vertical pieces 11 and 14 are protruded from the conductive cover 10 in a single direction as shown in FIG. 1(A), but not with crooked hooks or fingers. Therefore a shorter stainless steel plate is required. Also, the plate is bent only one time to form the vertical pieces 11 and 1. As a result, less material, simpler manufacturing processes, less labor hours, and higher yield are simultaneously obtained. Further, the tools for such machinery are smaller and less complicated. In summary, the manufacture cost is lower than that of prior arts.

Figure 2:
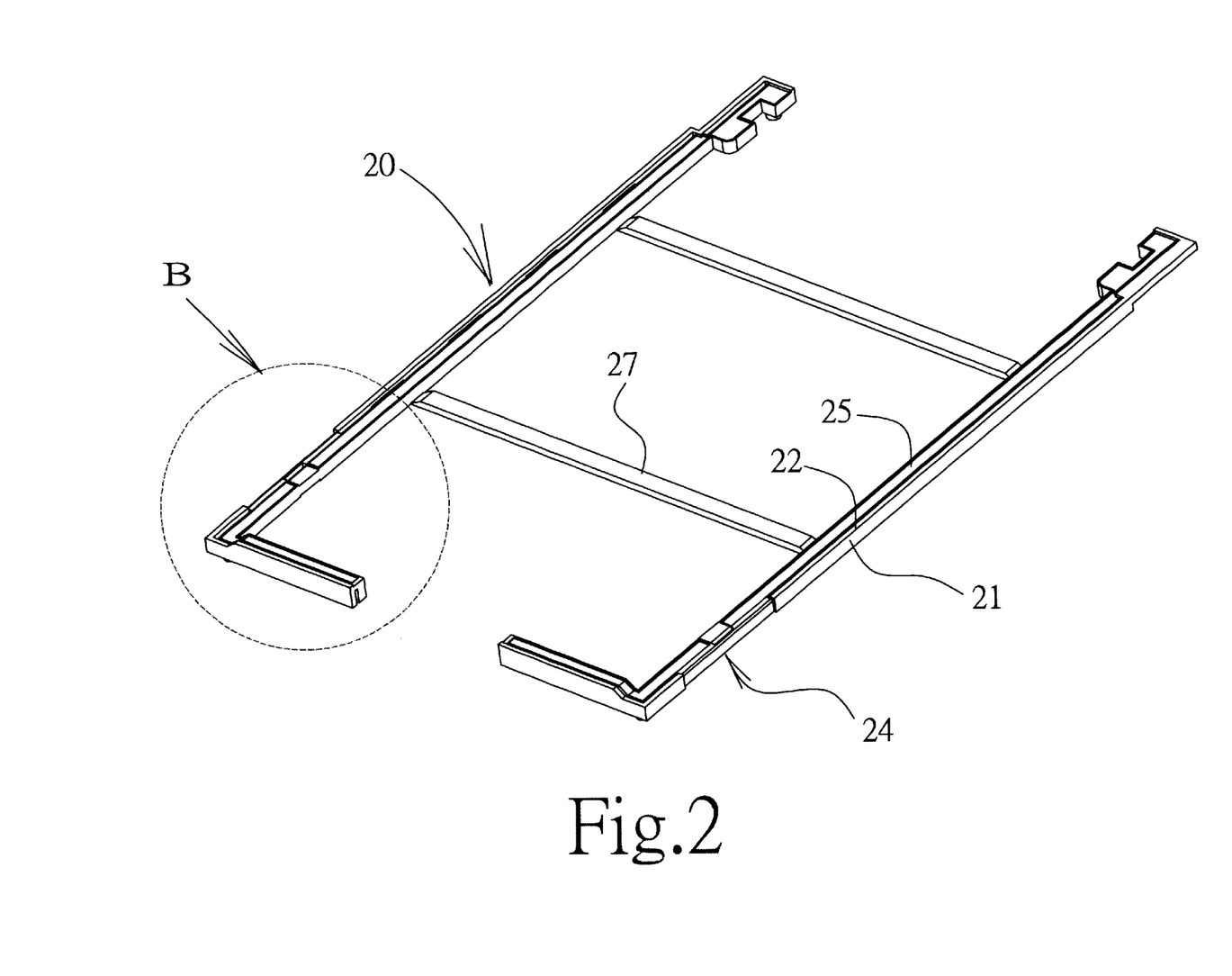
FIG. 2 is a perspective view of the first plastic frame.
Figure 2A:
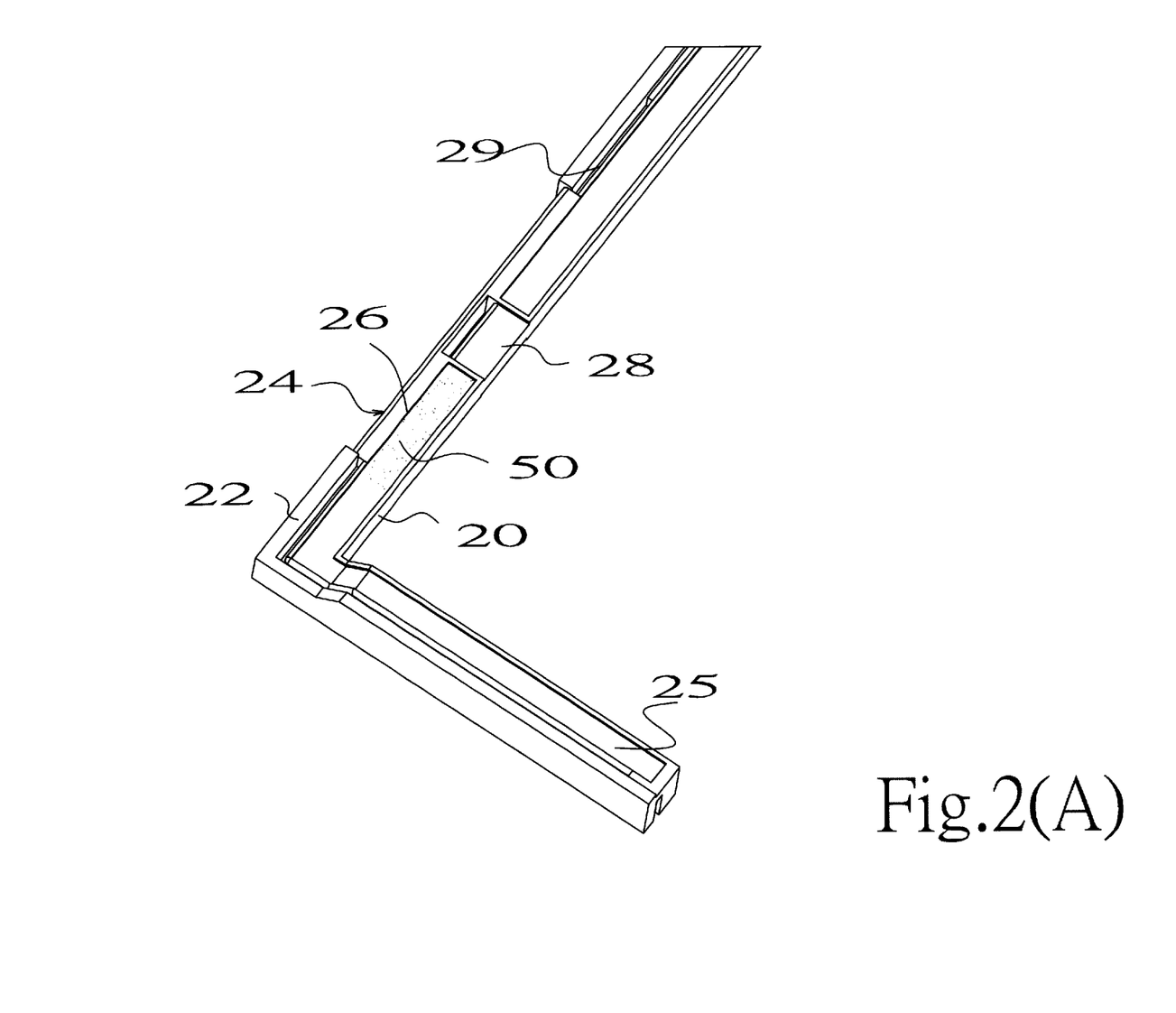
FIG. 2(A) is a close-up view of one end of the plastic frame shown in FIG. 2.
Figure 3:
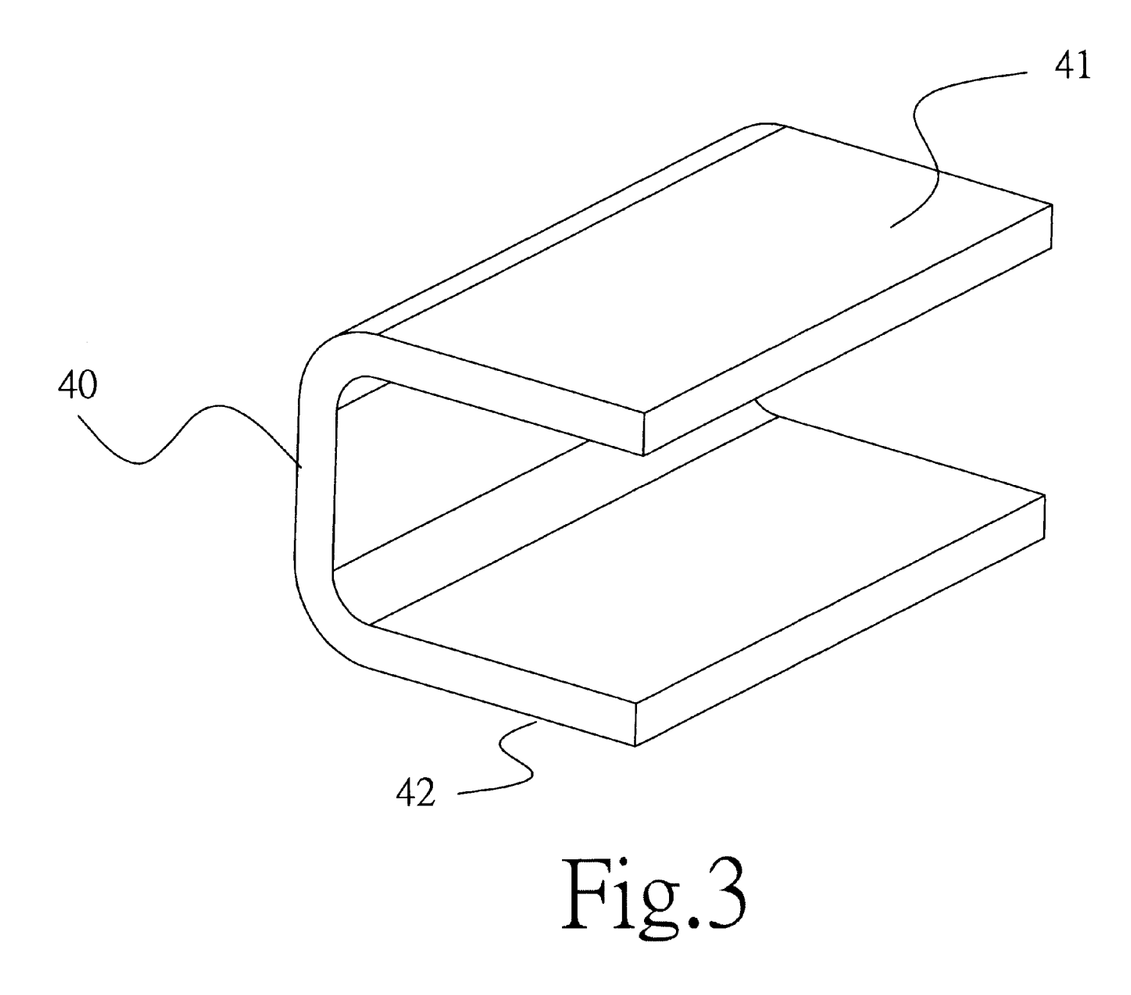
FIG. 3 is a perspective view of the conductive piece.
Figure 4:
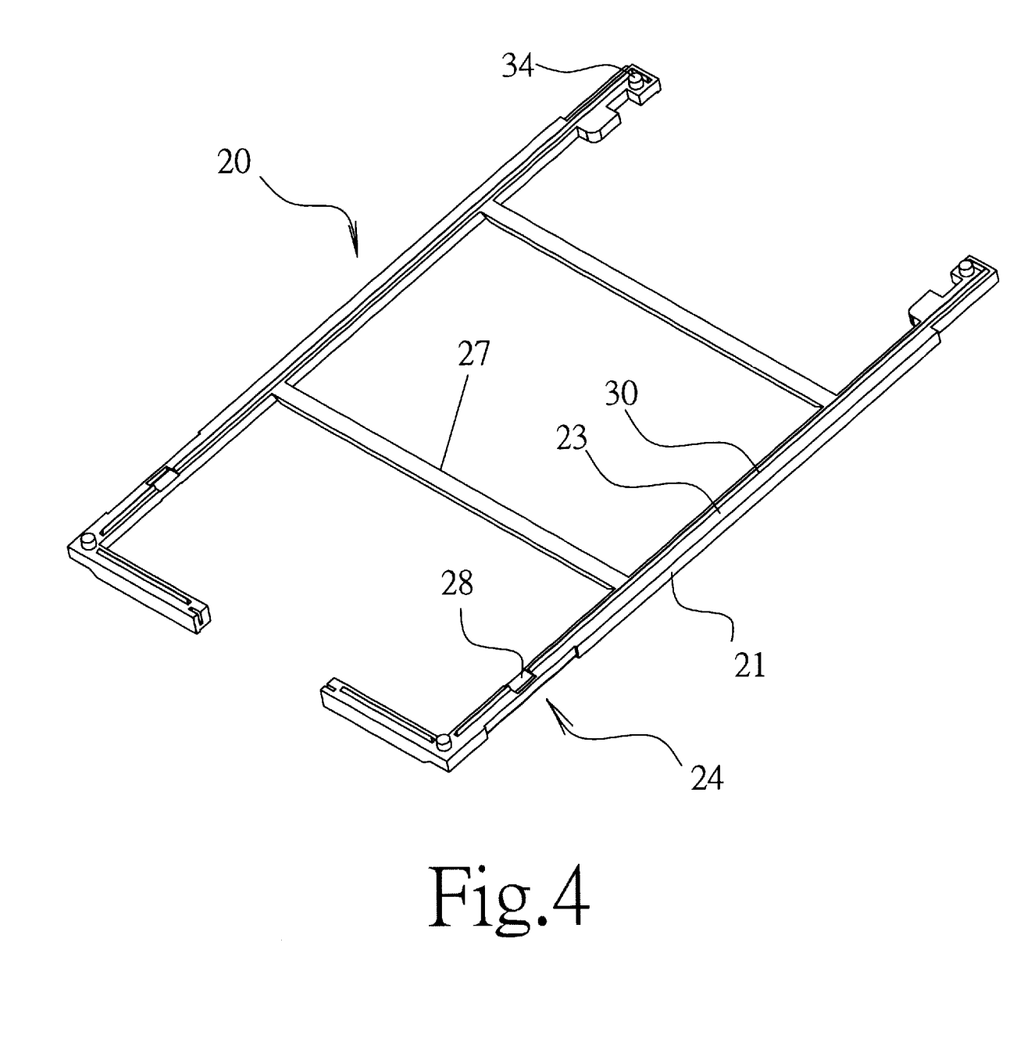
FIG. 4 is a perspective view of the plastic frame shown in FIG. 2 from another point.
Figure 5:
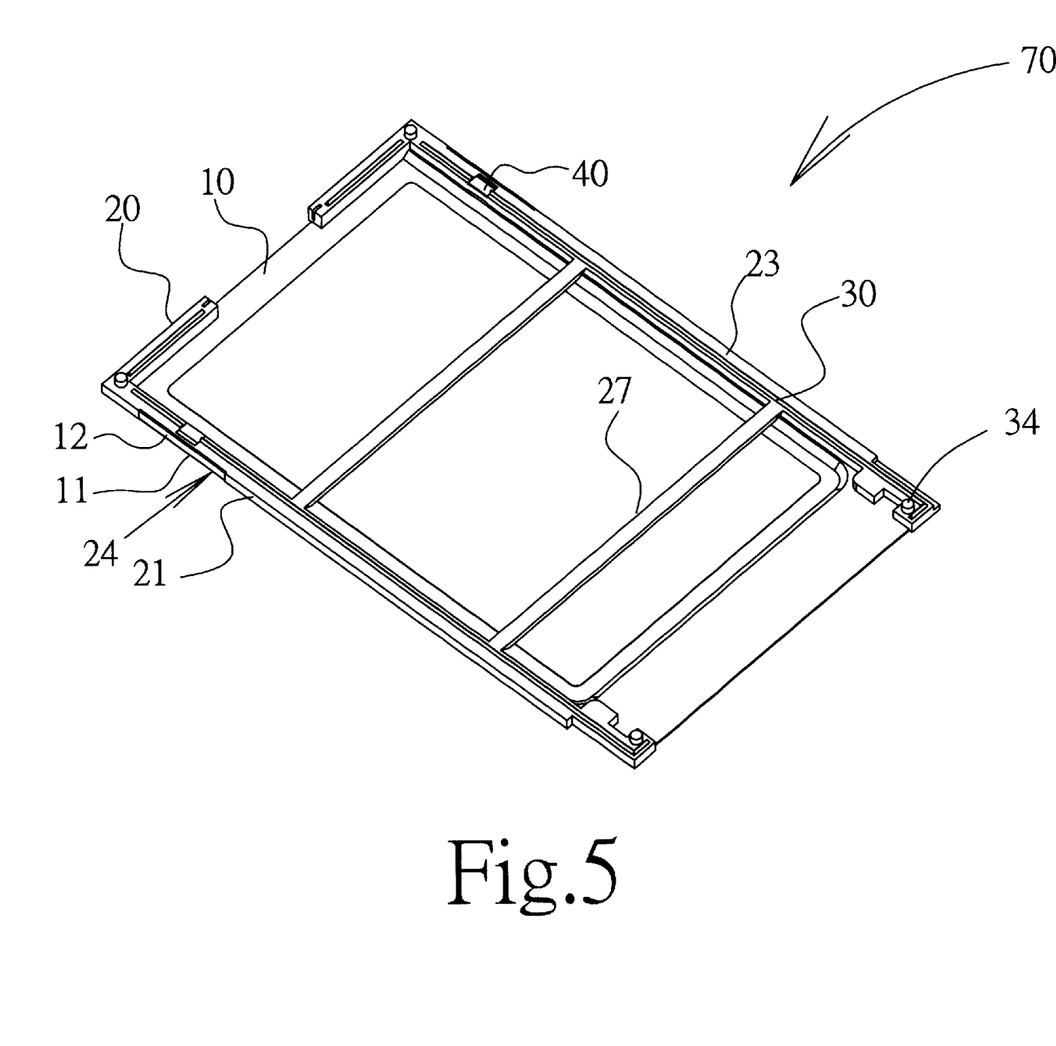
FIG. 5 is a perspective view of the plastic frame shown in FIG. 2 in attachment with the conductive cover shown in FIG. 1.

FIG. 2 is a perspective view of one embodiment of a first plastic frame, and the close-up marked as B in FIG. 2 is shown in FIG. 2(A). A plastic frame 20 is injection molded, whose left and right branches are connected together with connection bars 27 that will be removed by stamping after the plastic frame 20 is bonded with the conductive cover 10. The plastic frame 20 has an outer surface 21 and a first lateral surface 22 with a recess 24 formed on the outer surface 21 and extending into the plastic frame 20 in a position to match the vertical piece 11 of the conductive cover 10 and an adhesive area 25 formed on the first lateral surface 22 and extending into the plastic frame 20. As shown in FIG. 2(A), the edge of the adhesive area 25 is formed with a step 26 to limit the low-temperature adhesive 50 dispensed within the adhesive area 25 not spilt off when bonding the plastic frame 20 and conductive cover 10. Serial no. 3619 of Loctite Inc. is used for the low-temperature adhesive 50. The plastic frame 20 is formed with a trench or through hole 28 to clamp a conductive piece 40 preferably with a hook shape as shown in FIG. 3. The conductive piece 40 is made of copper or other electrical conductors and has a first contact surface 41 and a second contact surface 42. Preferably, the conductive piece 40 is elastic. When the plastic frame 20 is attached with the conductive cover 10, the first contact surface 41 contacts with the conductive cover 10. The plastic frame 20 has a groove 29 for insertion of the vertical piece 14 so as to increase the mechanical strength. Another view of the plastic frame 20 is shown in FIG. 4. A welding line 30 is formed on a second lateral surface 23 of the plastic frame 20, and positioning heads 34 are formed on the corner of the second lateral surface 23. When making a half case, the conductive piece 40 is clamped into the trench or through hole 28 of the plastic frame 20, the adhesive area 25 of the plastic frame 20 is dispensed with the low-temperature adhesive 50, and then the plastic frame 20 is pressed with the conductive cover 10 to form a half-case 70 as shown in FIG. 5.

Figure 6:
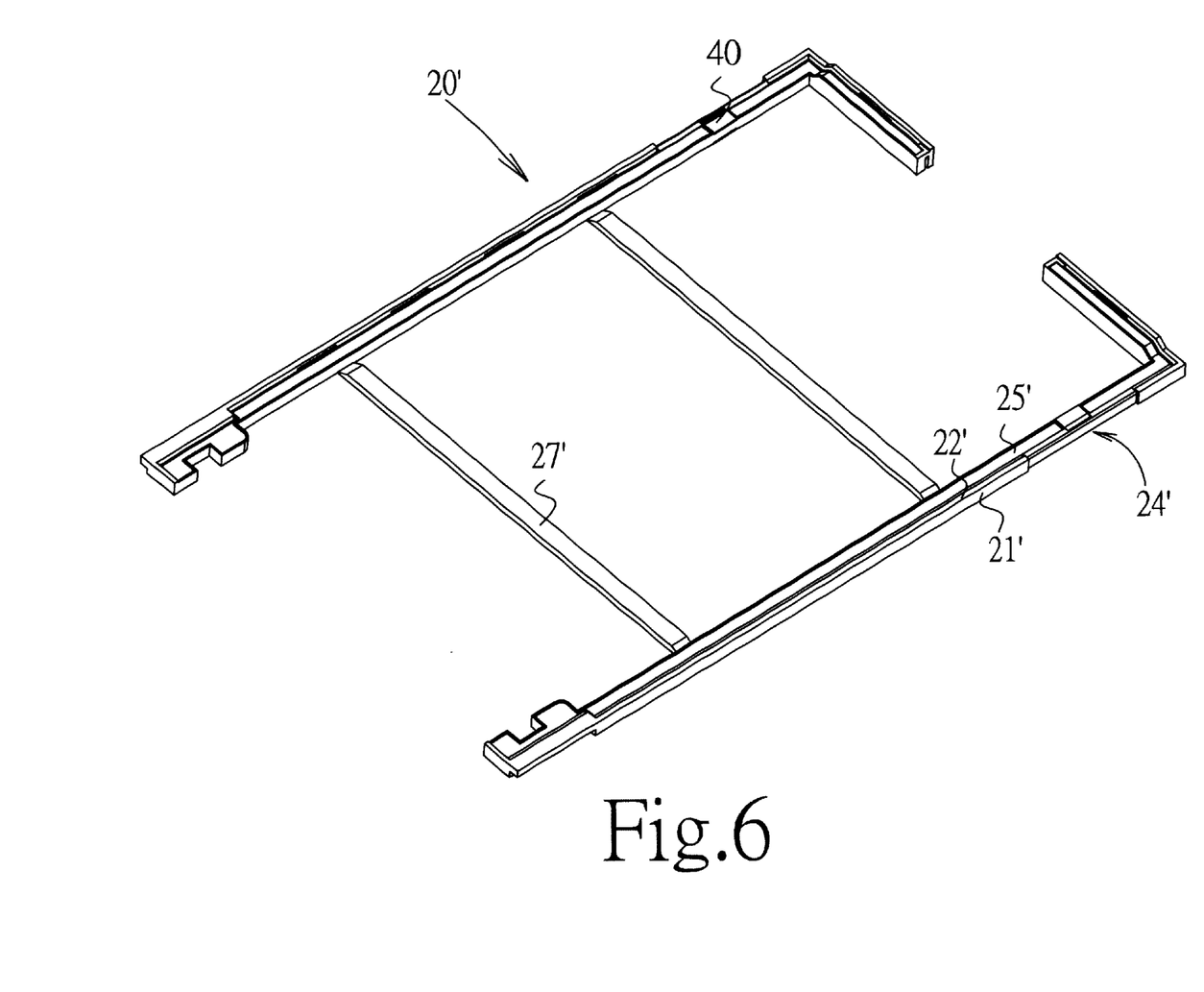
FIG. 6 is a perspective view of the second plastic frame.
Figure 7:
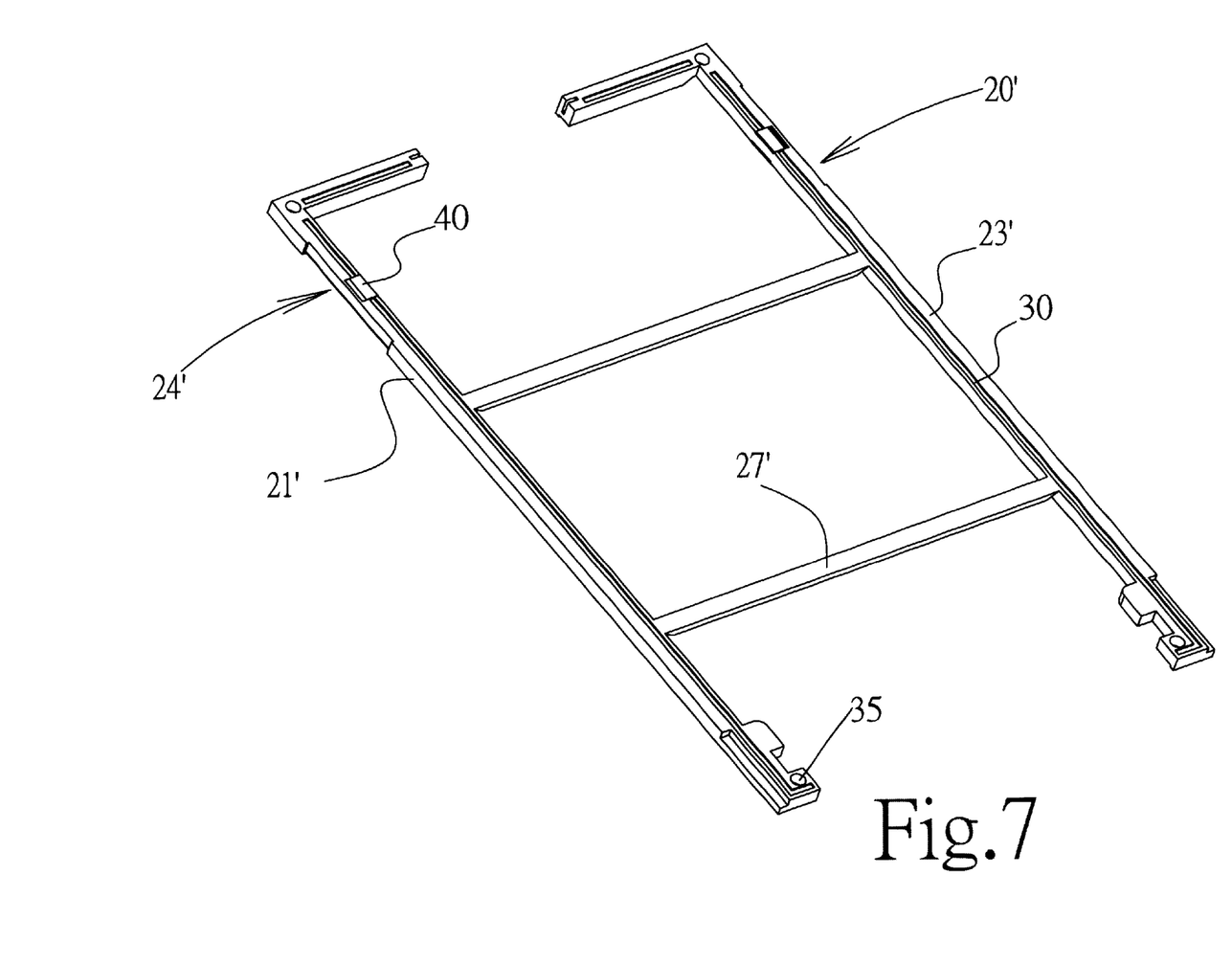
FIG. 7 is a perspective view of the plastic frame shown in FIG. 6 from another point.
Figure 8:
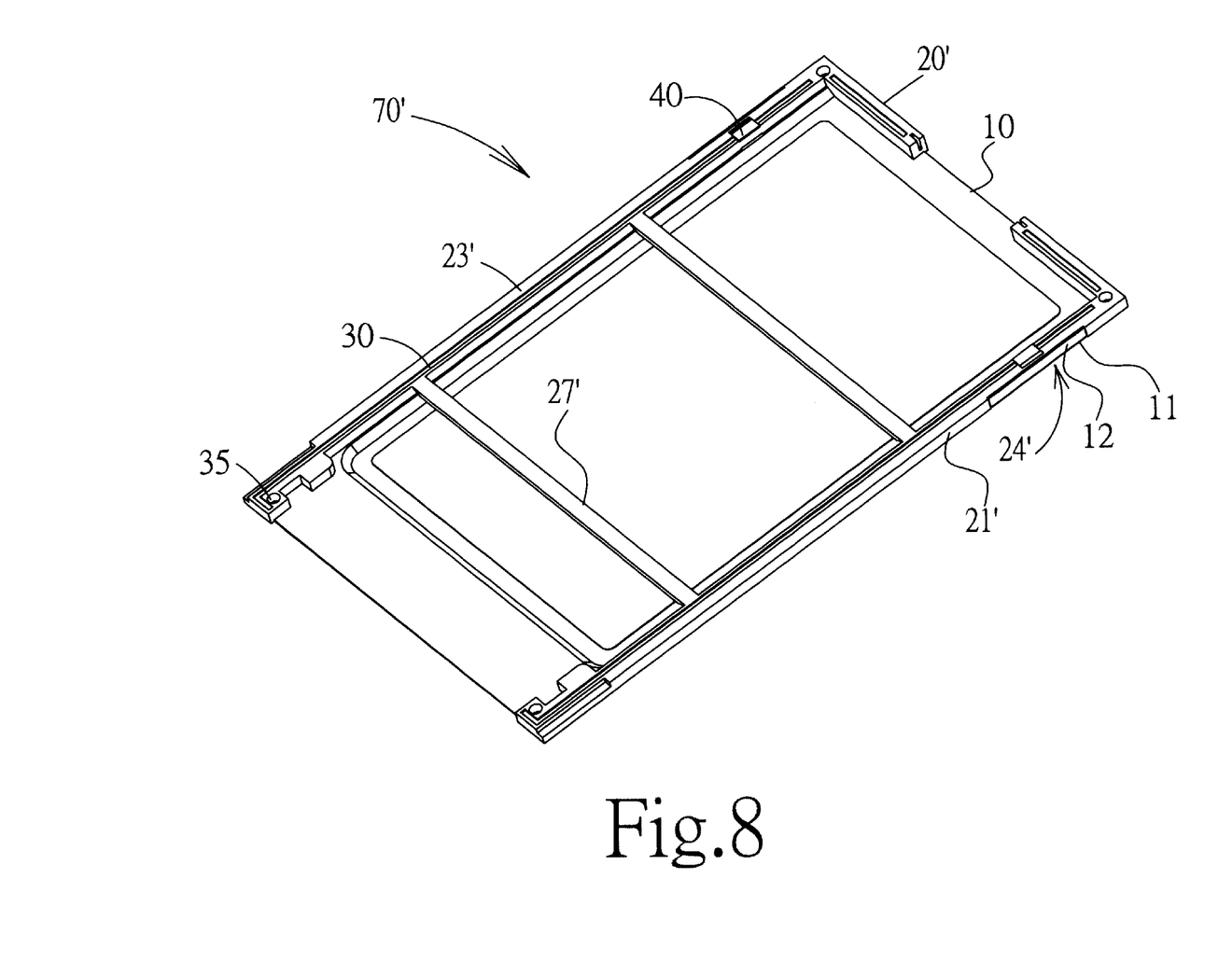
FIG. 8 is a perspective view of the plastic frame shown in FIG. 6 in attachment with the conductive cover shown in FIG. 1.

FIG. 6 and FIG. 7 show one embodiment of a second plastic frame 20' corresponding to the plastic frame 20. Except for the positioning holes 35 on the corners corresponding to the positioning heads 34 of the plastic frame 20, the plastic frame 20' mirrors the plastic frame 20. Its left and right branches are connected together with connection bars 27' that will be removed by stamping after the plastic frame 20' is bonded with a conductive cover 10. The plastic frame 20' has an outer surface 21' and a first lateral surface 22' with a recess 24' formed on the outer surface 21' and extending into the plastic frame 20' in a position to match the vertical piece 11 of the conductive cover 10 and an adhesive area 25' formed on the first lateral surface 22' and extending into the plastic frame 20' for dispensing with a low-temperature adhesive to bond the plastic frame 20' with the conductive cover 10. A welding line 30 is formed on the second lateral surface 23' of the plastic frame 20'. When making a half case, a conductive piece 40 is clamped into the trench or through hole 28' of the plastic frame 20', the adhesive area 25' of the plastic frame 20' is dispensed with a low-temperature adhesive 50, and then the plastic frame 20' is pressed with a conductive cover 10 to form a half-case 70' as shown in FIG. 8.

When assembling, align the half-cases 70 and 70' face-to-face, whose connection bars 27 and 27' have been removed, with the positioning heads 34 inserted into the positioning holes 35, and then the plastic frames 20 and 20' are bonded by sonic welding. At this time, the welding lines 30 will help the propagation of the sonic waves during the sonic-welding process. After the plastic frames 20 and 20' have been sonic-welded, the half-cases 70 and 70' are firmly bonded together to be a package of a card. The second contact surfaces 42 of two conductive pieces 40 respectively clamped on the plastic frame 20 and 20' contact with each other so that the conductive covers 10 of the half cases 70 and 70' are electrically connected. The vertical piece 11 of the conductive cover 10 is used for the connection to the system reference of the electronic apparatus inserted with the card.

Figure 9:
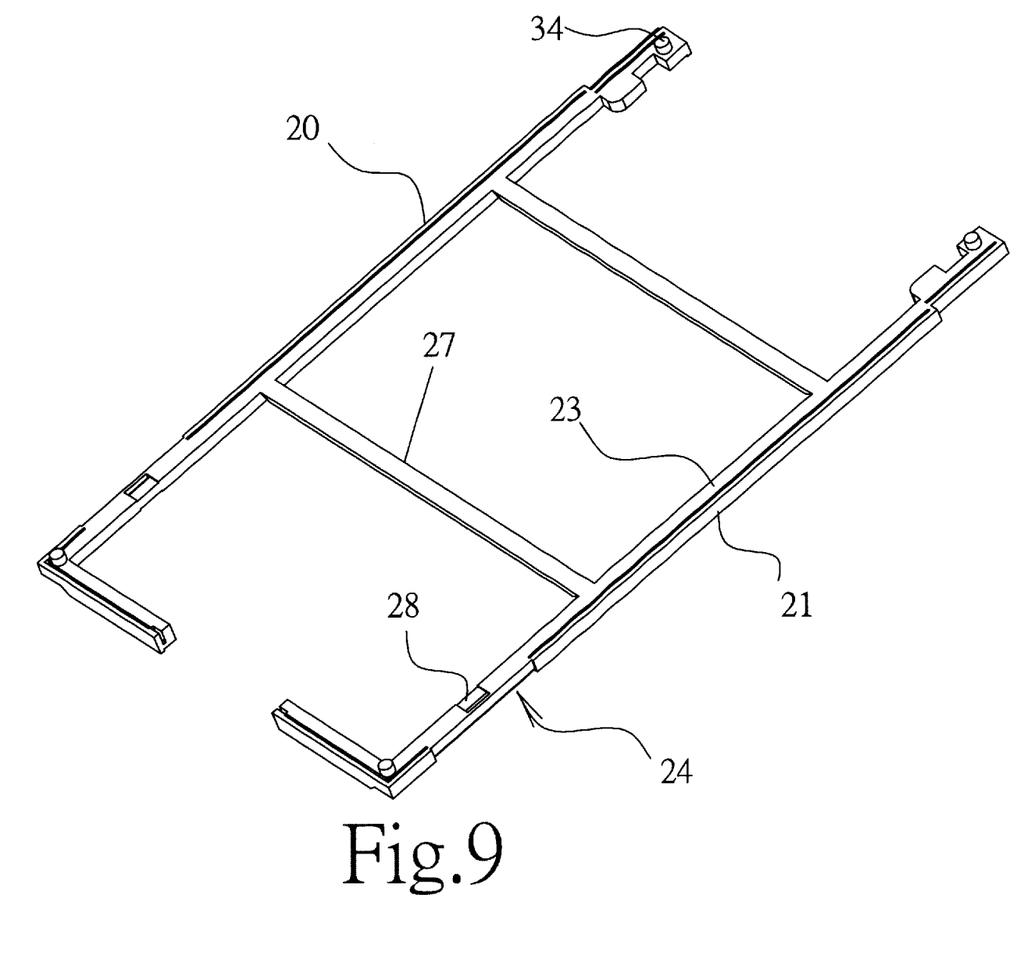
FIG. 9 is a perspective view of a second embodiment of the first plastic frame.

FIG. 9 is a perspective view of a second embodiment of the first plastic frame 20, in which no welding line exists on the second lateral surface 23. Before proceeding with the sonic welding for the plastic frames, the second lateral surface 23 is coated with a corrosive chemical, e.g., tetrahydrofuran (THF) of Sheng-Ho Co., Ltd., so that micro roughness is formed on the second lateral surface 23 due to corrosion caused by the chemical. The rough surface will help the propagation of the sonic waves during the sonic welding process, so that two plastic frames can be bonded together more easily.

Figure 10:
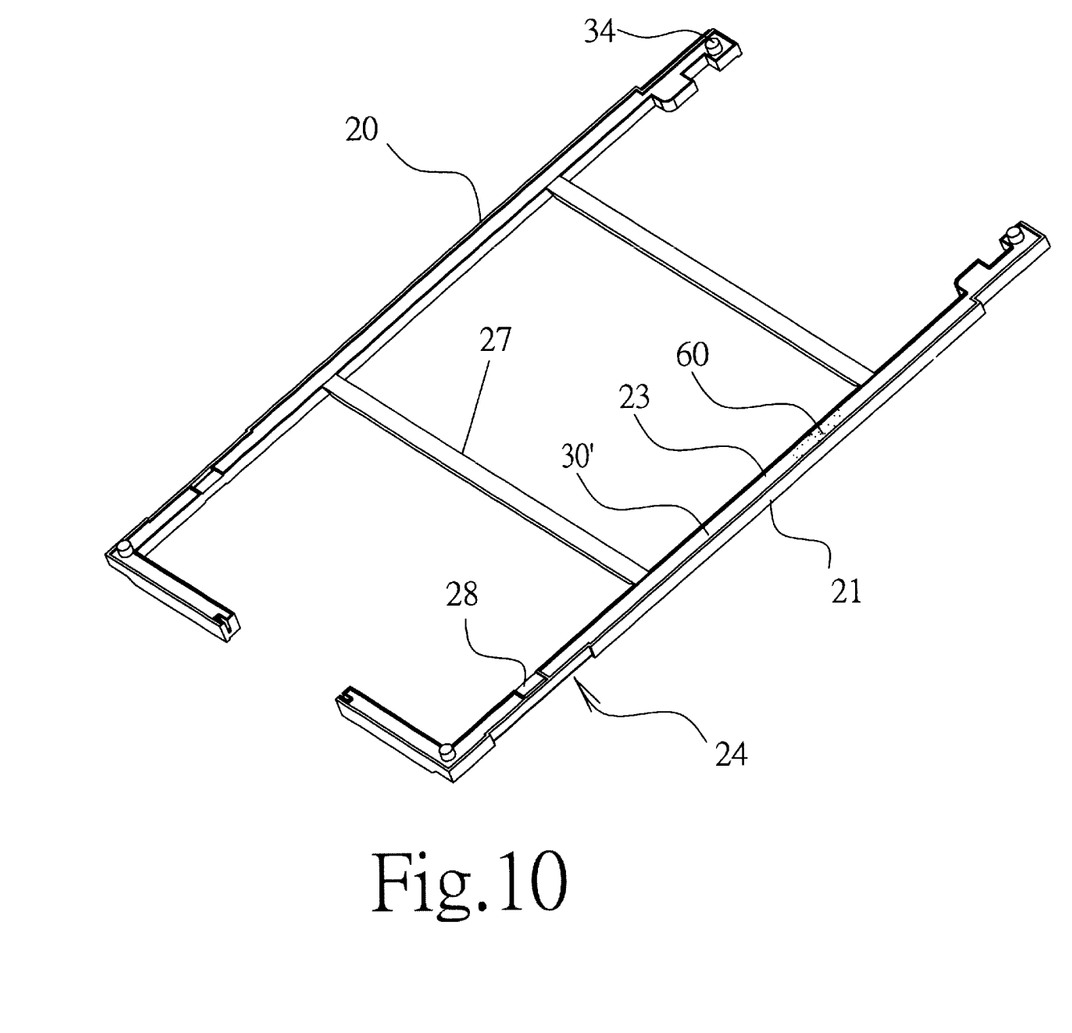
FIG. 10 is a perspective view of a third embodiment of the first plastic frame.

FIG. 10 is a perspective view of a third embodiment of the first plastic frame 20, in which an adhesive area 31 is formed on the lateral surface 23 preferably extending into the plastic frame 20 to be dispensed with an adhesive 60 so as to bond another plastic frame. In this embodiment, two face-to-face plastic frames are bonded together with the adhesive, rather than by sonic welding.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A package method for a card comprising the steps of:
    forming a first and second conductive covers each having a side vertical piece;
    forming a first and second plastic frames each having an outer surface, a first and second lateral surfaces with a recess formed on said outer surface corresponding to said vertical piece and an adhesive area formed along said first lateral surface;
    respectively dispensing a low temperature adhesive onto said adhesive area;
    respectively attaching said first and second conductive covers with said first and second plastic frames to form first and second half cases; and
    combining said second lateral surfaces together to bond said first and second half cases.

2. A package method of claim 1, wherein said second lateral surfaces are combined by sonic welding.

3. A package method of claim 2, wherein at least one of said second lateral surfaces is formed with a welding line for said sonic welding.

4. A package method of claim 2, further comprising applying a chemical to corrode at least one of said second lateral surfaces before proceeding with said sonic welding.

5. A package method of claim 1, wherein said second lateral surfaces are combined with an another adhesive.

6. A package method of claim 5, wherein at least one of said second lateral surfaces is formed with an another adhesive area extending into said plastic frame for dispensing with said another adhesive thereon.

7. A package method of claim 1, further comprising respectively clamping said first and second plastic frames with first and second conductive pieces to electrically contact with said conductive cover and each other.

8. A package method of claim 7, wherein said plastic frame is formed with a trench for clamping said conductive piece.

9. A package method of claim 7, wherein said plastic frame is formed with a through hole for clamping said conductive piece.

10. A package method of claim 1, wherein said adhesive area is formed extending from said first lateral surface into said plastic frame.

11. A package method of claim 1, wherein said second lateral surfaces are formed with corresponding positioning holes and heads for bonding themselves.

12. A package method of claim 1, wherein said vertical piece has an outer surface not lower than said outer surface of said plastic frame.

13. A package method of claim 1, wherein said plastic frame has two branches connected by at least one connection bar that is removed before combining said second lateral surfaces.

* * * * *